United States Patent
Uehling et al.

(10) Patent No.: US 9,659,831 B2
(45) Date of Patent: May 23, 2017

(54) METHODS AND STRUCTURES FOR DETECTING LOW STRENGTH IN AN INTERLAYER DIELECTRIC STRUCTURE

(71) Applicants: Trent S. Uehling, New Braunfels, TX (US); Ilko Schmadlak, Feldkirchen (DE)

(72) Inventors: Trent S. Uehling, New Braunfels, TX (US); Ilko Schmadlak, Feldkirchen (DE)

(73) Assignee: NXP USA, Inc., Austin, TX (US)

( * ) Notice: Subject to any disclaimer, the term of this patent is extended or adjusted under 35 U.S.C. 154(b) by 209 days.

(21) Appl. No.: 14/341,294

(22) Filed: Jul. 25, 2014

(65) Prior Publication Data
US 2016/0027705 A1   Jan. 28, 2016

(51) Int. Cl.
*G01R 31/26* (2014.01)
*H01L 21/66* (2006.01)
*G01R 31/00* (2006.01)
*G01R 31/02* (2006.01)

(52) U.S. Cl.
CPC ............ *H01L 22/12* (2013.01); *G01R 31/003* (2013.01); *G01R 31/02* (2013.01); *H01L 22/34* (2013.01)

(58) Field of Classification Search
CPC ............ G01R 31/2644; G01R 31/2856; G01R 31/2858; G01R 31/2884; H01L 22/32; H01L 22/34; H01L 22/12
See application file for complete search history.

(56) References Cited

U.S. PATENT DOCUMENTS

| | | | |
|---|---|---|---|
| 5,468,541 A * | 11/1995 | Hsu | H01L 22/34 428/209 |
| 6,066,561 A | 5/2000 | Kumar et al. | |
| 7,638,424 B2 | 12/2009 | Richter et al. | |
| 8,618,827 B2 | 12/2013 | Shao et al. | |
| 2009/0027074 A1 * | 1/2009 | Ko | G01R 31/2875 324/750.11 |
| 2015/0247231 A1 * | 9/2015 | Nguyen | C23C 14/042 219/444.1 |

* cited by examiner

*Primary Examiner* — Zandra Smith
*Assistant Examiner* — Evan Clinton

(57) ABSTRACT

A method for manufacturing a semiconductor device is disclosed. The method includes generating a thermo-mechanical stress within a plurality of layers of a wafer, and after generating the thermo-mechanical stress, testing an interfacial strength level associated with one or more of the plurality of layers.

20 Claims, 3 Drawing Sheets

METHODS AND STRUCTURES FOR DETECTING LOW STRENGTH IN AN INTERLAYER DIELECTRIC STRUCTURE

BACKGROUND

Field

This disclosure relates generally to semiconductor devices, and more specifically, to a method of detecting low strength in an interlayer dielectric (ILD) structure.

Related Art

In modern semiconductor technologies, a major packaging challenge is delamination and cracking of Low-k and Ultra-Low-k (ULK) ILD films in the back end of line (BEOL) stack during or after packaging processing steps. This delamination is a result of the reduced strength of these new ILD films (both adhesive and cohesive strength) combined with stresses introduced by packaging materials with significantly different thermal expansion coefficients. The delamination failure mode is difficult to detect as an electrical signature is not always immediately present, and the separation caused by the delamination can be on the order of 50 microns or less. Furthermore, natural variation in wafer fabrication processes can result in a further reduced strength of some wafers and low level failure rates.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and semiconductor devices disclosed herein provide semiconductor wafers that can be easily screened using a quick stress test during the wafer-level probe test. The stress test circuit is contained within the wafer scribe street, so no semiconductor die real estate is consumed. In the past, wafers were not screened for low strength laminations until the die were sent for packaging. Package-level screening (mechanical and electrical) is time consuming and lags the semiconductor wafer production by weeks. By the time package-level screens are completed, the wafer lot is committed to package assembly and the associated incurred costs. Failure in a package-level screen may necessitate disposition of a large quantity of packaged units. By conducting tests for low strength lamination at the wafer-level, semiconductor wafers can be quickly dispositioned during the wafer fabrication process, prior to test and packaging steps.

Figure 1:
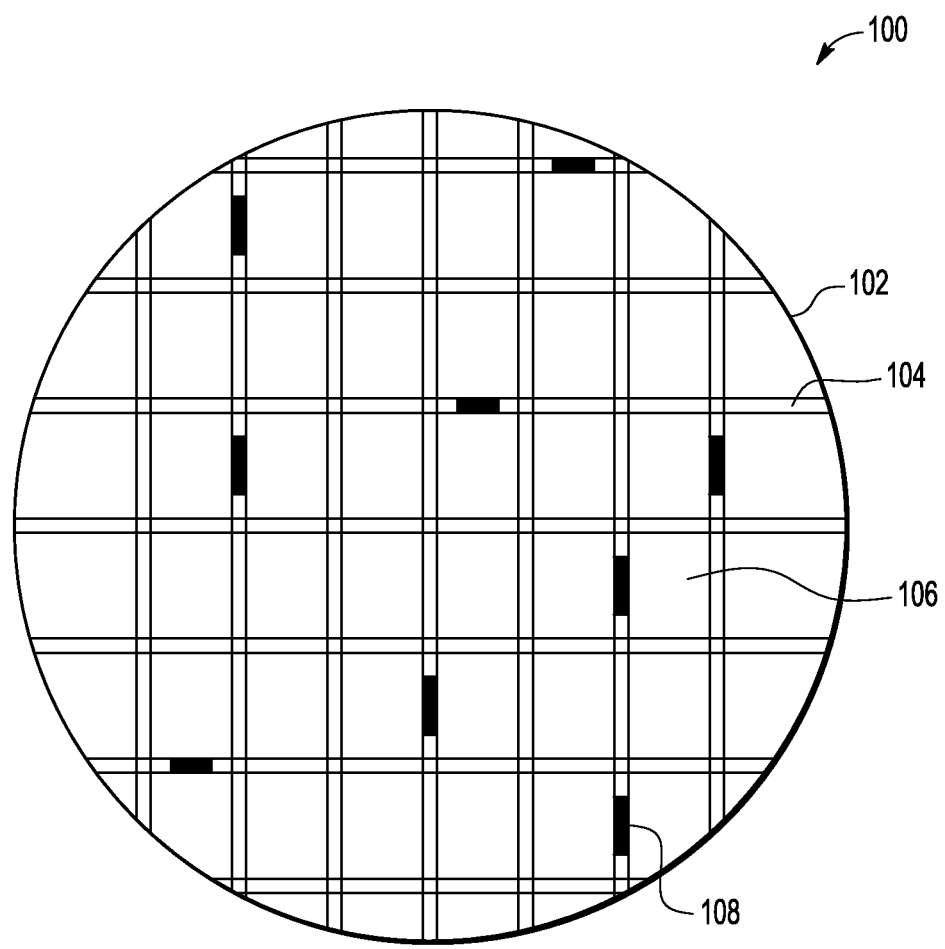
FIG. 1 shows a top view of an embodiment of a semiconductor wafer in accordance with the present invention.

FIG. 1 illustrates a top view of an embodiment of semiconductor wafer test system 100 having a semiconductor wafer 102 with a plurality of integrated circuit (IC) die 106 surrounded by scribe streets 104 with test circuits 108 formed thereon. As the size of integrated circuit components decreases, low dielectric constant (low-k) materials, and other technologies are being used to make small and high-speed semiconductor devices in wafer 102. Along with these advancements, the challenges of maintaining yield and throughput have also increased. For example, the low-k materials are generally of low mechanical strength and are prone to crack or delaminate in the BEOL stack of die 106, thereby reducing reliability of the devices.

Individual die 106 within the wafer 102 contain circuitry, and the die 106 are singulated by sawing through the scribe streets 104. One or more die 106 are packaged together. Test circuits 108 are simultaneously fabricated on the wafer along with the circuitry for die 106. Probe pads (not shown) are located in the scribe streets 104 between die 106 to electrically couple to an external terminal through a metal pad to circuitry in test circuit 108. During fabrication, the test circuits 108 are tested at various steps to assure device quality of semiconductor die 106.

When at least one layer of the multi-layer BEOL stack structure of wafer 102 is composed of a metal material with a high thermal expansion coefficient, the dimensional variation of the layer can be sufficient to introduce high-level internal stress into the wafer 102. Consequently, die 106 can suffer damage, such as peeling, delamination, or dielectric fracture, especially when the multi-layer structure includes inter-metal-dielectric layers of low-k or ULK dielectric materials.

Test circuits 108 include a heater that can be activated before die 106 are singulated to generate thermo-mechanical stress high enough to exceed specifically low strength caused by process variations during wafer build. The resulting delaminations or cracks in areas of such reduced adhesion or cohesion strength between and within layers of wafer 102 can be detected by a test structure that includes a set of serially-connected vias. When applying a low test voltage on a closed test circuit established with two test pads 202 that are connected by this set of serially-connected vias in the BEOL stack, a ruptured test via caused by a planar delamination or crack, would be detected. The vias extend between two or more layers of wafer 102 where delamination may occur. When thermo-mechanical stress is experienced, one or more of the vias may break, causing an open connection in the chain of serially connected vias. The ability to determine whether die 106 are likely to experience reliability problems associated with delamination, allows die 106 to be removed from further manufacturing steps, thereby saving time and cost associated with further processing, testing, and packaging the die 106 before the delamination problems are discovered.

Figure 2:
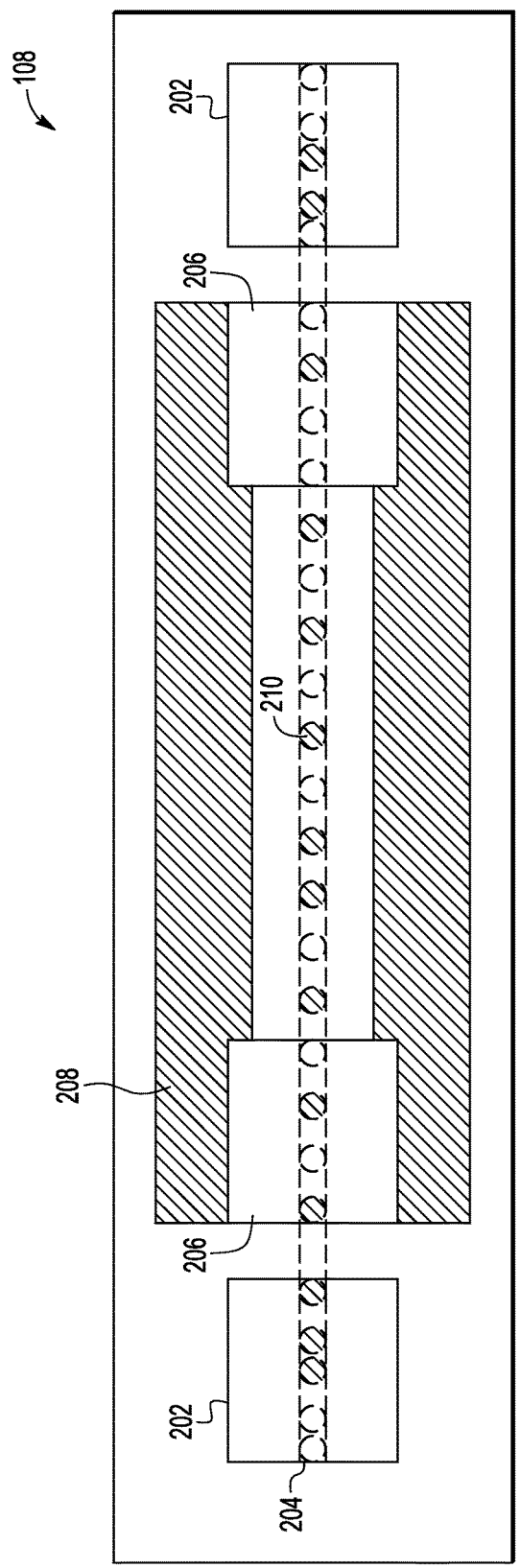
FIG. 2 shows a top view of an embodiment of a test circuit that can be included on the semiconductor wafer of FIG. 1.
Figure 3:
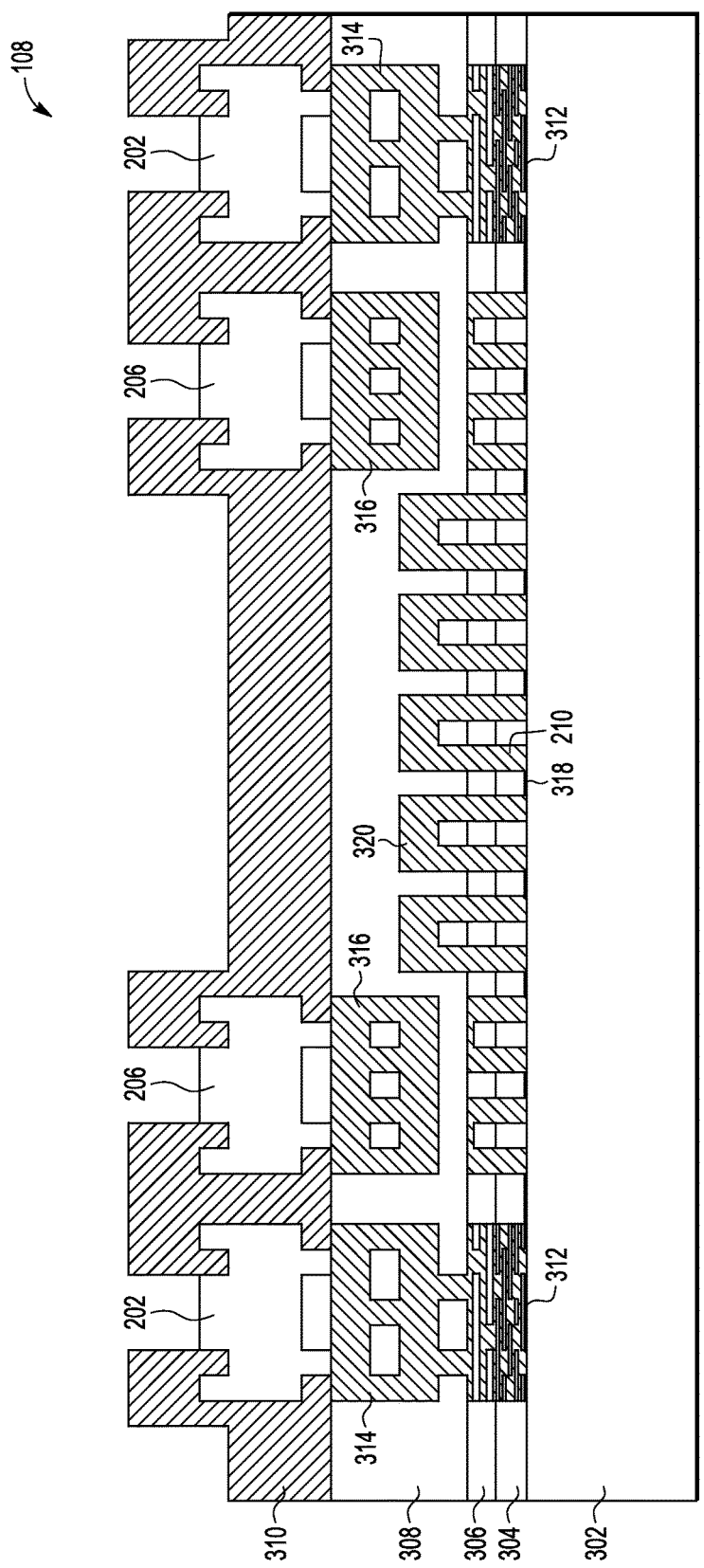
FIG. 3 shows a cross-section view of the embodiment of the test circuit of FIG. 2.

FIGS. 2 and 3 show respective top and side cross-section views of an embodiment of test circuit 108 that can be included on the semiconductor wafer test system 100 of FIG. 1. Test circuit 108 includes test pad 202, via chain 204, heater pad 206, and heater element 208 formed in layers of wafer 102 (FIG. 1). The layers of wafer 102 include ultra low-k dielectric layer 304, low-k dielectric layer 306, one or more silicide layers 308, and passivation layer 310 deposited or formed on substrate 302. The layer composition, order, and thickness are for illustration purposes. Many other combinations are possible.

Test pads 202 are formed using electrically conductive material such as aluminum or copper in or on passivation layer 310 with top surfaces exposed for access by a test probe (not shown). One test pad 202 is coupled to one end of via chain 204 and another test pad 202 is coupled to another end of via chain 204. Via chain 204 includes a number of electrically conductive vias 210 formed through ultra-low-k and low-k interlayer dielectric layers 304, 306. Some of the vias 210 may extend into other layers, such as silicide layer 308, to test strength of the laminations at the boundary between low-k dielectric layer 306 and silicide layer 308.

Each via 210 is coupled in series to an adjacent via to form via chain 204 with conductive trace 318 and interconnects 320. In the embodiment shown, conductive trace 318 is formed at the top surface of substrate 302 and is connected at the bottom of vias 210. Via interconnects 320 are formed at the top of vias 210. Each end of trace 318 is coupled to respective probe circuitry 312. Other configurations of conductive trace 318 and interconnects 320 can be used, however. For example, the conductive trace 318 may be formed at the top of the vias 210, or a combination of the top and bottom of vias 210, and interconnects 320 may be formed at the bottom or a combination of the top and bottom of vias 210 corresponding to the opposite position of the conductive trace 318.

Via interconnects 320 and conductive trace 318 are configured to alternately connect the bottom and top of adjacent vias with one another to form a daisy chain or serial connection that allows a stress fracture penetrating through one or more of vias 210 to be detected as an open circuit in via chain 204. The term daisy chain refers to the top of one via 210 being connected to the top of an immediately adjacent via 210, and the bottom of immediately adjacent via 210 being connected to the bottom of the next immediately adjacent via 210. For example the bottom of first and second adjacent vias are connected by an interconnect 320 only at the top, the second and third adjacent vias are connected the by conductive trace 318 only at the bottom, and so on. Via chain 204 may be arranged in a straight line or curved line through any suitable dimension in the layers 302-310 of test circuit 108 to be tested, such as horizontally, vertically, diagonally, or combination thereof. Two or more via chains 204 and corresponding test pads 202 and heater pads 206 can be included in test circuit 108.

Vias 210 can be formed with a minimum feature size, (also referred to as "minimum size"), which is the smallest dimension for a feature that can be printed using a particular photolithography system.

Semiconductor substrate 302 described herein can be any semiconductor material or combinations of materials, such as gallium arsenide, silicon germanium, silicon-on-insulator (SOI), silicon, monocrystalline silicon, the like, and combinations of the above. Ultra low-k layer 304 typically has a dielectric constant less than 2.4, and low-k layer 306 typically has a dielectric constant between 2.4 and 3.9.

Silicide layer 308 may be composed of one or more layers of glass material such as a first layer of tetraethyl orthosilicate (TEOS) and/or a second layer of undoped silicon glass (USG). A portion of at least some of vias 210 may extend into silicide layer 308 to test the strength of adhesion between silicide layer 308 and low-k dielectric layer 306.

Passivation layer 310 can be formed of nitride, oxide or any other passivation material being used by a fabricator making the devices. The thickness of passivation layer 310 can be any suitable thickness.

Test pads 202 and heater pads 206 are formed of electrically conductive materials. Test pads 202 are formed in or on passivation layer 310 with top surfaces exposed for access by a test probe (not shown). Heater pads 206 are also formed in or on passivation layer 310 with top surface exposed for contact with a voltage supply to cause heating elements 316 to generate heat in test circuit 108.

Heating elements 316 are positioned below and in contact with heating pads 206 in a location where thermo-mechanical stress generated by heating elements 316 is applied to one or more of layers 302-310 of test circuit 108 in the proximity of via chain 204. Heating elements 316 may be implemented with a resistive element, metallic structure made of copper or other suitable material, or other device that generates heat when conducting current. Other suitable devices and mechanisms for generating heat in test circuit 108 can be used in addition to or instead of heating elements 316 that generate heat when conducting current.

During stress tests, a voltage is applied to heater pads 206, causing heating elements 316 to generate heat by Joule heating in test circuit 108 to test the interfacial strength of at least some of layers 302-310 of wafer 102. Interfacial strength refers to cohesive strength within layers 302-310 as well as adhesive strength between layers 302-310. The temperature level provided by heater elements 316 is similar to temperatures expected during further processing, testing, packaging and/or operation of die 106. For example, temperatures generated by heating elements 316 can range between 200 degrees Celsius to 500 degrees Celsius or other suitable temperature(s).

Heating elements 206 can subject layers and interfaces 304-310 and vias 210 to peel stress and tensile stress when heated acting in the normal direction to the interface planes. Peel or tensile stresses refer to a force that acts on a certain interface area, trying to pull an adhesive apart by separating one or more of layers 304-310.

Once the thermo-mechanical stress is applied at a level expected to cause delamination interfaces with undesirable low strength, a test probe can be used to apply a test voltage between the two test pads 202 coupled to one another by via chain 204. If a current flow can be measured between test pads 202, the via chain 204 is not broken and it is not likely that ILD interfaces have delaminated. If no current flow can be achieved between test pads 202, the via chain 204 is broken and an open connection is proven in via chain 204 due to delamination of one or more layers 302 to 310. This is a strong signal for a crack that nucleated in an ILD layer or interface, propagating long enough to gain the energy required to rupture the via chain.

By now it should be appreciated that in some embodiments, a method for manufacturing a semiconductor device can include generating a thermo-mechanical stress within a plurality of layers (302, 304, 306, 308, 310) of a wafer (102), and after generating the thermo-mechanical stress, testing an interfacial strength level associated with one or more of the plurality of layers.

In another aspect, generating the thermo-mechanical stress can comprise generating peel stress at the plurality of interfaces between layers.

In another aspect, generating the thermo-mechanical stress can comprise generating a tensile stress at the plurality of layers.

In another aspect, generating the thermo-mechanical stress can comprise applying a voltage to a heating structure (208) of the wafer, wherein the heating structure can comprise a metallic structure (316) in the plurality of layers.

In another aspect, the heating structure further can comprise a conductive pad (206) electrically coupled to the metallic structure.

In another aspect, the metallic structure can be composed substantially of copper.

In another aspect, the wafer can comprise a scribe street, and the heating structure can be within the scribe street.

In another aspect, testing the adhesive strength level can comprise probing a test structure (201, 312, 314, 318, 320)

of the wafer. The test structure can comprise a test pad (202); and a via (210) electrically coupled to the test pad. The via is in the plurality of layers.

In another aspect, the via can be a minimum-size via.

In another aspect, the wafer can comprise a scribe street, and the test structure is within the scribe street.

In another aspect, the plurality of layers can include a plurality of dielectric layers (304, 306).

In another aspect, generating the thermo-mechanical stress can comprise generating the thermo-mechanical stress over a portion of the wafer, and the test structure can comprise a plurality of vias, the via being one of the plurality of vias, the plurality of vias electrically coupled to one another in series.

In other embodiments, a semiconductor wafer can comprise a plurality of die areas (106) with a scribe street between (104) the plurality of die areas. The scribe street can comprise a plurality of layers. Within the scribe street, a heating structure can comprise a metallic structure in the plurality of layers. The metallic structure can be operable to generate a thermo-mechanical stress within the plurality of layers. A test structure can be operable to test an interfacial strength level associated with one or more of the plurality of layers. The test structure can comprise a test pad, and a via electrically coupled to the test pad, wherein the via is in the plurality of layers.

In another aspect, the via can be a minimum-size via.

In another aspect, the plurality of layers can include a plurality of dielectric layers.

In another aspect, the test structure can comprise a plurality of vias, the via being one of the plurality of vias, the plurality of vias electrically coupled to one another to form an open circuit if at least one of the vias is broken.

In another aspect, the thermo-mechanical stress can comprise a peel stress at the plurality of interfaces between layers.

In another aspect, the thermo-mechanical stress can comprise a tensile stress at the plurality of wafers.

In another aspect, the heating structure further can comprise a conductive pad electrically coupled to the metallic structure.

In still other embodiments, a method for manufacturing a semiconductor device can comprise applying a voltage to a heating structure within a scribe street of a wafer. The heating structure can comprise a metallic structure in a plurality of layers within the scribe street. After applying the voltage, a test structure within the scribe street can be probed. The test structure can comprise a test pad and a plurality of vias electrically coupled to one another. The plurality of vias are electrically coupled to the test pad and are in the plurality of layers.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor wafer comprising:
   a plurality of die areas;
   a scribe street between the plurality of die areas, the scribe street comprising a plurality of layers; and
   within the scribe street:
      a heating structure comprising a metallic structure in the plurality of layers, the metallic structure operable to generate a thermo-mechanical stress within the plurality of layers; and
      a test structure operable to indirectly test an interfacial strength level associated with one or more of the plurality of layers, the test structure comprising:
         a test pad; and
         a daisy chain of vias electrically coupled to the test pad, wherein the daisy chain of vias is in the plurality of layers, and the heating structure is in at least one of the plurality of layers as the daisy chain of vias.

2. The semiconductor wafer of claim 1, wherein vias in the daisy chain of vias are minimum-size vias.

3. The semiconductor wafer of claim 1, wherein the plurality of layers includes a plurality of low-k dielectric layers.

4. The semiconductor wafer of claim 1, wherein the daisy chain of vias are electrically coupled to one another to form an open circuit if at least one of the vias is broken.

5. The semiconductor wafer of claim 1, wherein the thermo-mechanical stress comprises a peel stress at the plurality of layers.

6. The semiconductor wafer of claim 1, wherein the thermo-mechanical stress comprises a tensile stress at the plurality of wafers.

7. The semiconductor wafer of claim 1, wherein the heating structure further comprises a conductive pad electrically coupled to the metallic structure.

8. A semiconductor device, comprising:
   a heating structure configured to generate a thermo-mechanical stress within a plurality of layers of a wafer; and
   a test structure configured to test an interfacial strength level associated with one or more of the plurality of layers, wherein the test structure comprises a plurality of vias electrically coupled to one another in a daisy chain, and the heating structure is in at least one of the plurality of layers as the at least one of the plurality of vias.

9. The semiconductor device of claim 8, wherein the thermo-mechanical stress generates peel stress at the plurality of layers.

10. The semiconductor device of claim 8, wherein the thermo-mechanical stress generates a tensile stress at the plurality of layers.

11. The semiconductor device of claim 8, wherein the thermo-mechanical stress applies a voltage to a heating structure, wherein the heating structure comprises a metallic structure in the plurality of layers.

12. The semiconductor device of claim 11, wherein the heating structure further comprises a conductive pad electrically coupled to the metallic structure.

13. The semiconductor device of claim 11, wherein the metallic structure is composed substantially of copper.

14. The semiconductor device of claim 11, further comprising a scribe street, and the heating structure is within the scribe street.

15. The semiconductor device of claim 8, wherein the test structure further comprises:
a test pad electrically coupled to the plurality of vias.

16. The semiconductor device of claim 15, wherein the plurality of vias are minimum-size vias.

17. The semiconductor device of claim 15, wherein the wafer comprises a scribe street, and the test structure is within the scribe street.

18. The semiconductor device of claim 8, wherein the plurality of layers includes a plurality of dielectric layers.

19. The semiconductor device of claim 15, wherein:
the thermo-mechanical stress is generated over an area of the wafer.

20. A semiconductor device, comprising:
a heating structure within a scribe street of a wafer, wherein the heating structure comprises a metallic structure in a plurality of layers within the scribe street;
a voltage supply coupled to the heating structure; and
a test structure within the scribe street, wherein the test structure comprises:
a test pad; and
a plurality of vias electrically coupled to one another in a daisy chain, the plurality of vias electrically coupled to the test pad, wherein the plurality of vias is in the plurality of layers, and the heating structure is in one or more of the plurality of layers with at least a portion of at least one of the plurality of vias.

* * * * *